US008504116B2

(12) United States Patent
Ciatti et al.

(10) Patent No.: US 8,504,116 B2
(45) Date of Patent: **\*Aug. 6, 2013**

(54) VEHICLE ENTERTAINMENT SYSTEM WITH MULTI-SOURCE PRESETS

(75) Inventors: Anthony Ciatti, Ann Arbor, MI (US); John Thomas Kosinski, II, River Rouge, MI (US); Michael Dean Tschirhart, Ann Arbor, MI (US); Wes Albert Nagara, Commerce Township, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 463 days.

This patent is subject to a terminal disclaimer.

(21) Appl. No.: 12/651,552

(22) Filed: Jan. 4, 2010

(65) Prior Publication Data
US 2010/0138787 A1 Jun. 3, 2010

Related U.S. Application Data

(63) Continuation-in-part of application No. 12/062,776, filed on Apr. 4, 2008.

(60) Provisional application No. 61/019,082, filed on Jan. 4, 2008, provisional application No. 61/142,480, filed on Jan. 5, 2009.

(51) Int. Cl.
*H04M 1/00* (2006.01)

(52) U.S. Cl.
USPC ............... 455/569.2; 455/550.1; 455/186.1; 455/3.06; 455/98

(58) Field of Classification Search
USPC ............... 455/569.2, 550.1, 186.1, 3.06, 98
See application file for complete search history.

(56) References Cited

U.S. PATENT DOCUMENTS

| | | | |
|---|---|---|---|
| 8,095,065 B2 * | 1/2012 | Nagara et al. | 455/3.06 |
| 2002/0046084 A1 * | 4/2002 | Steele et al. | 705/14 |
| 2002/0070852 A1 | 6/2002 | Trauner et al. | |
| 2003/0038849 A1 | 2/2003 | Craven et al. | |
| 2004/0122572 A1 | 6/2004 | Ichinose | |
| 2005/0172230 A1 * | 8/2005 | Burk et al. | 715/716 |
| 2005/0280524 A1 | 12/2005 | Boone et al. | |
| 2007/0057928 A1 | 3/2007 | Prados et al. | |
| 2007/0198472 A1 | 8/2007 | Simonds et al. | |
| 2009/0176468 A1 * | 7/2009 | Ciatti et al. | 455/185.1 |

FOREIGN PATENT DOCUMENTS
EP 1560102 A2 8/2005

OTHER PUBLICATIONS

Web page from CarAudioDesign.co.uk for: Kenwood KVT-M707 7" Touch-Screen Monitor with RDS Tuner; Dec. 10, 2007.

\* cited by examiner

*Primary Examiner* — Sanh Phu
(74) *Attorney, Agent, or Firm* — Dickinson Wright PLLC

(57) ABSTRACT

A system and method for providing single-action multi-source presets for vehicle entertainment systems. The method includes the steps of engaging a single-action preset button that changes the active input source to a selected preprogrammed input source and performing an action within that input source.

5 Claims, 7 Drawing Sheets

VEHICLE ENTERTAINMENT SYSTEM WITH MULTI-SOURCE PRESETS

CROSS REFERENCE TO RELATED APPLICATION

This application is a Continuation-In-Part of U.S. application Ser. No. 12/062,776 filed on Apr. 4, 2008 entitled "Vehicle Entertainment System With Multi-Source Presets" which claims the benefit of U.S. Provisional Application No. 61/019,082, filed Jan. 4, 2008. This application also claims the benefit of U.S. Provisional Application No. 61/142,480 filed Jan. 5, 2009. The entire disclosures of the referenced applications being considered part of the disclosure of this application and hereby incorporated by reference.

BACKGROUND OF THE INVENTION

1. Technical Field

The present invention is directed to a system and method for providing single-action multi-source presets for vehicle entertainment systems, and climate control systems, including the ability to perform incomplete single actions and more specifically to a system and method that allows multi-source presets without recording user sequences.

2. Discussion

Manufacturers have long produced cars having radios with preset or favorite buttons that allow a user to quickly and easily select a desired radio station for the current radio band. As vehicle radios have become more complex and added additional options to become vehicle entertainment systems, these preset or favorite buttons have not changed.

Originally, preset buttons manually moved an analog tuner of the radio to an estimated position, regardless of whether the radio was tuned to the FM or AM band. Therefore, a preset for a particular FM radio station would not work as a preset for a particular AM radio station when the radio was tuned to the AM band as the preset would instead move the tuner to the desired FM position. After pressing the presets, the user also had to adjust the tuner to fine tune the radio to optimally receive the desired broadcast. Due to the mechanical nature of the preset buttons, pressing the preset to move the tuner from one end to of the band to the other end required significant force. Over time, many of these mechanical preset buttons would fail due to their mechanical nature, and not move the tuner to the desired position.

As radios started using digital tuners, many of the problems associated with mechanical preset buttons were eliminated. Digital preset buttons are easy to push and their digital nature allows for precise tuning. Digital preset buttons also allowed a preset button to include at least one favorite radio station for each radio band, thereby allowing for many more presets than analog presets and without requiring additional space. More specifically, digital presets change their set selections depending on the selected radio band, such as the user being able to assign an AM frequency selection and an FM frequency selection to the same preset button. As the FM radio band gained popularity, to allow different users of a vehicle to each have their own FM presets or provide additional preset options to a user, many vehicles would provide an FM1 and FM2 selection. However, the preset buttons were limited to selecting a set preset from the current audio source, such as AM, FM1, or FM2, and were only available when the associated audio source was selected and active.

As vehicle radios move to multi-platform vehicle entertainment systems, the preset functions have remained essentially the same even though radios now use a variety of signals in addition to the common AM and FM bands to create a complete entertainment system. More particularly, vehicle radios or vehicle entertainment systems may include or receive multiple sources, such as AM, FM, Satellite Radio, tape, CD, CD changers, MP3 devices, USB devices, music players, IPods, memory devices, navigation systems and other sources. Even though the entertainment systems include more sources, the preset buttons, as illustrated in FIG. 5, still only allow selection of radio stations, more particularly only allow selections of AM, FM, and in some instances satellite favorite radio stations. Therefore, if a user desires to change from a current FM radio frequency to another favorite AM radio frequency or Satellite Radio channel; the user must first change the source selection and then select the desired preset button to select the desired frequency or channel. This multi-step process to change between favorite stations on different signal sources may distract a user's attention from the road.

Although some radios have presets that allow selection of a particular CD in a CD changer, a particular CD cannot be selected until the CD changer is selected as the source input. Preset buttons also still do not allow for favorite inputs or selections relating to sources other than the current source. For example, while in the FM radio source, the user cannot select individual albums or files on an MP3 or USB device using a preset button. Also, if a user is listening to an audio book on a MP3 player, and then desires to listen to the radio, such as an FM radio station, the user cannot select the particular desired radio station with a single push of a preset button or a single-action that changes the input for the vehicle entertainment system from the audio book to the FM band and the desired FM radio station directly in a single button push.

Even though vehicle entertainment systems now commonly include large displays for graphical content, the presets have remained hard keyed and all available preset buttons are still only programmable for the currently selected source.

Some vehicle entertainment systems also include an integrated climate control system which may make it more difficult or time consuming for the user to enter desired settings, as compared to traditional knob climate control systems. In addition, even some stand-alone climate control systems may require multiple steps to perform a desired function at a designed temperature. Therefore, there is a need for a simplified interface for climate control systems.

SUMMARY OF THE INVENTION

In view of the above, the preset invention is directed to multi-source or multi-command single-action preset and favorite selections for users of vehicle entertainment systems, and climate control systems and a method of implementing such single-action preset commands without the use of voice commands.

A vehicle generally includes a vehicle entertainment system having a display. A climate control system also typically includes a display, which in some instances may be integrated into a single display with the display of the vehicle entertainment system. The vehicle entertainment system may receive multi-source inputs such as FM, AM, and satellite radio signals. Also, the vehicle entertainment system may receive CD, DVD, and tape inputs. Some vehicle entertainment systems may further receive signals or act as interfaces for TV signals, USB devices, memory devices, storage devices, music players, navigation systems, phones and even internet connections.

Most automotive climate control systems typically allow a user to set a desired temperature or dual desired temperatures, as well as a desired output program, such as splitting air at a temperature of 72° F. between the defrost vents and floor vents, or for different speeds. As vehicle operators change, it may require multiple steps for the operator to set the temperature and desired output programs.

The present invention includes single-action preset buttons that through a single-action allow selection of an entertainment source and a particular selection within that source, even when the current source is different from the selected source, or when applied to climate control systems, a particular output source and a desired temperature. The source may be any desired input or content source and the particular selection within that source. The preset buttons may be hard keyed or soft keyed. Soft key buttons include both physical buttons having corresponding indicators on an adjacent display or touch screen buttons solely located on the display. The system also allows for incomplete multi-source selections that bring a user to desired point and then allow the user to select the desired final input. For example, while listening to a CD, the user may desire to switch to a mass storage device, such as an Ipod or MP3 player, and within that source a particular artist. The preset may be a single-action that takes the user to a point where the user then selects the desired artist.

The present invention is particularly useful with systems having a touch interface display. The preset invention allows for a user to easily configure and provide soft key favorites in combination with a touch screen display. The preset invention eliminates the need to switch between sources before selecting favorites by providing programmable soft key favorites regardless of the current source and desired source.

Further scope of applicability of the preset invention will become apparent from the following detailed description, claims, and drawings. However, it should be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The preset invention will become more fully understood from the detailed description given here below, the appended claims, and the accompanying drawings in which:

DETAILED DESCRIPTION OF THE PREFERRED EMBODIMENT

The preset invention is directed to a vehicle entertainment system 10 having single-action presets 30 that provide one touch access to favorite sources or simplify steps to a favorite source across different input sources. As illustrated in the figures, the system 10 generally includes a plurality of single-action presets 30. The single-action presets 30 allow easy selection of or communication with a specific input source from a plurality of input sources received by, in communication with, or capable of being output by the system and a specific selection or action within the specific input source.

Figure 4:
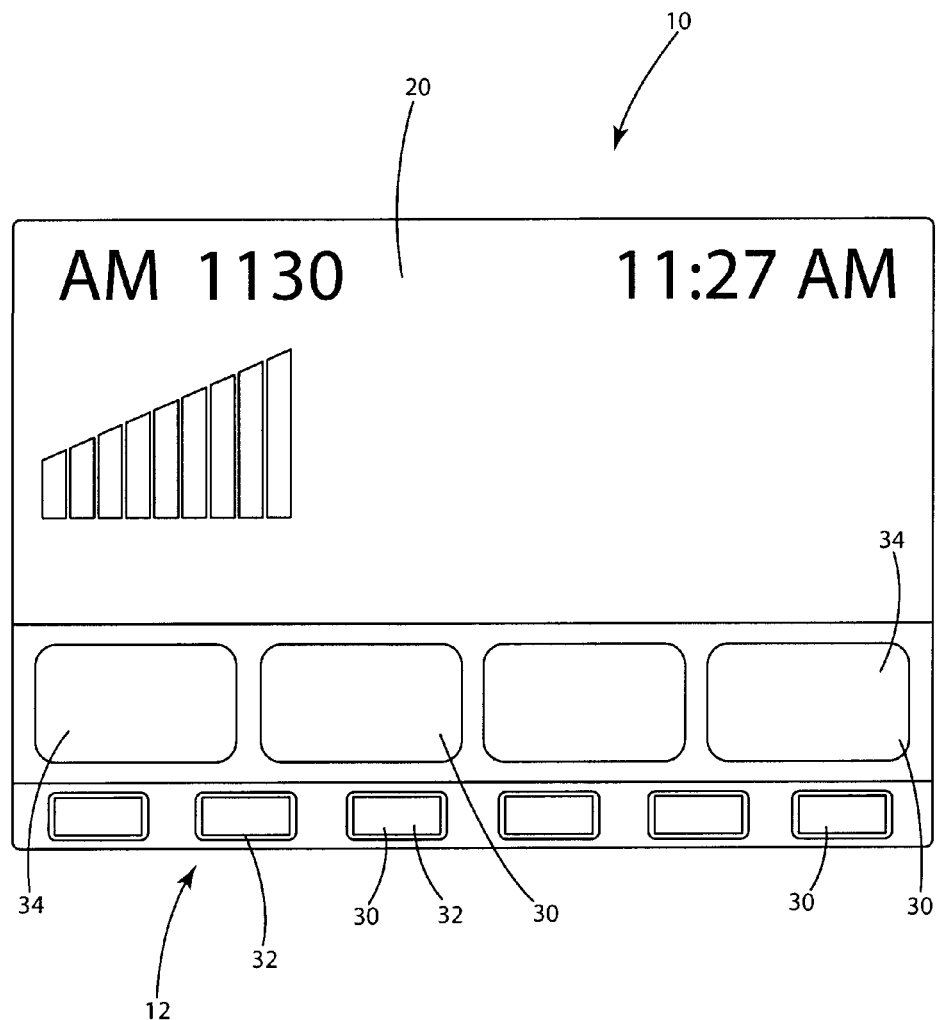
FIG. 4 is a schematic diagram of an exemplary vehicle entertainment system with an exemplary AM radio skin showing desirable information and soft key and hard key preset keys which may be directed to single source AM favorites or multi-source favorites.
Figure 5:
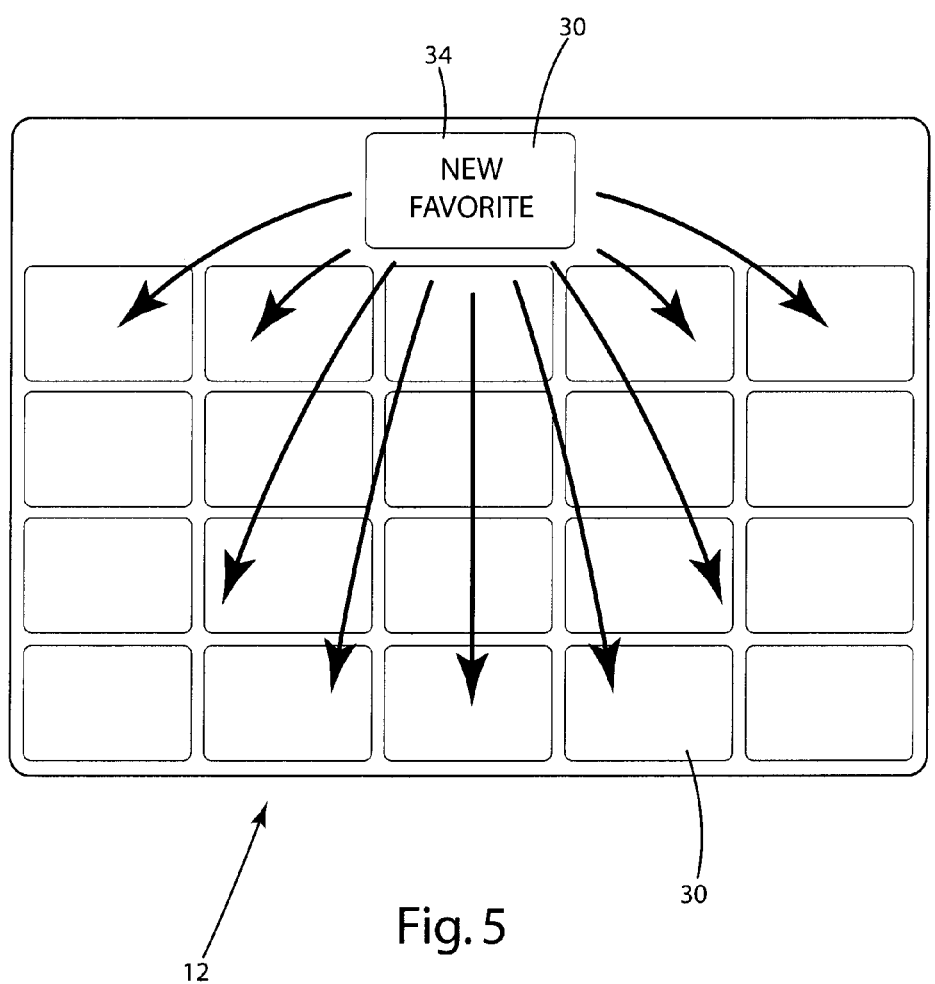
FIG. 5 is a schematic diagram illustrating the ease of adding a new favorite over existing favorites into a multi-source favorite selection schemed.
Figure 6:
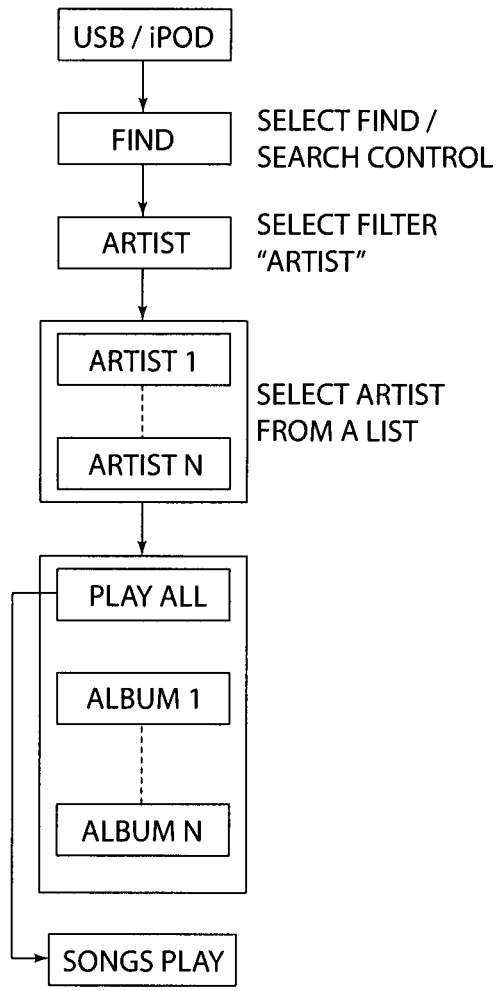
FIG. 6 is a schematic diagram of an existing exemplary method of instructing a device to play all songs by a particular artist.
Figure 7:
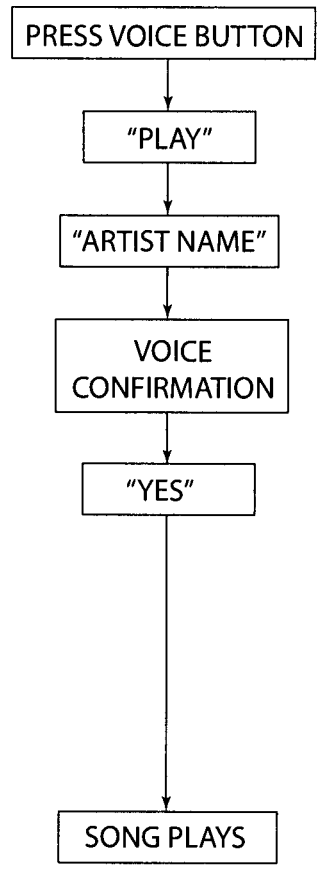
FIG. 7 is a schematic diagram of an existing exemplary method of instructing a device through preprogrammed voice commands to play all songs by a particular artist.
Figure 8:
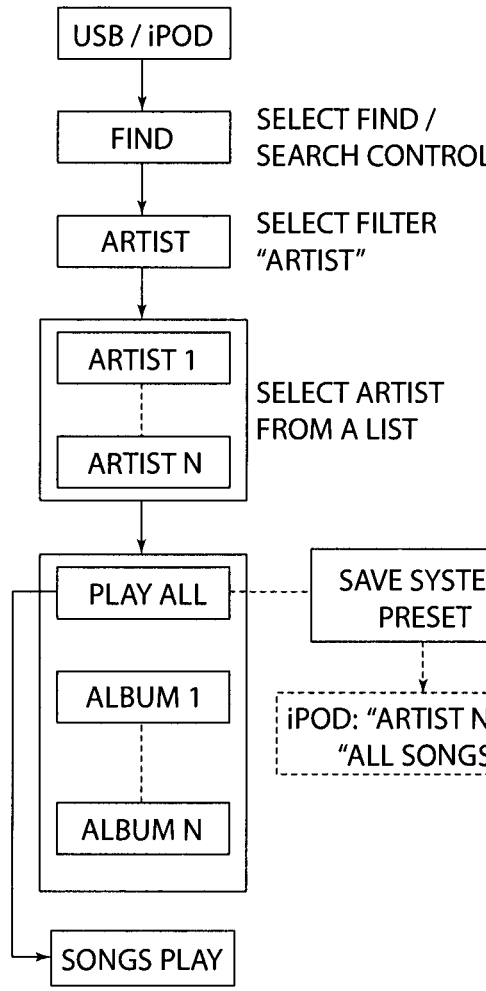
FIG. 8 is a schematic diagram of a method of programming a system by a user preset to play all songs associated with a particular artist.
Figure 9:
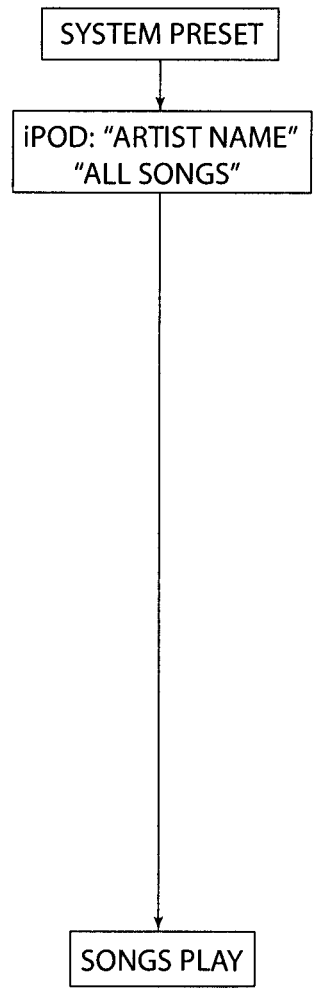
FIG. 9 is a schematic diagram of the method of the present invention to use user preprogrammed system presets to play all songs by a particular artist with a single touch.

The system 10 may be any entertainment system, but as illustrated in the figures, the present invention is particularly applicable to vehicle entertainment systems. The system may also apply to many climate control system, in particular those climate control systems integrated into a vehicle entertainment system. While the interface 12 of the system may take on any desired configuration, the figures primarily illustrate the vehicle entertainment system 10 as having a touch screen display 20 with soft key preset buttons 34. Of course, any style preset buttons may be used, including the hard key presets 32 as illustrated in FIG. 4. The user interface 12 may also be configured in any desired manner and use a variety of different styles of single-action preset buttons 30. For example, the presets 30 may be accessed through the illustrated soft touch presets 34, hard key presets 32, or a scroll dial input (not illustrated). As illustrated in the figures, the vehicle entertainment system 10, and specifically the user interface 12, may include a display 20 that is touch screen sensitive to allow inputting of data or selection of inputs, and in particular, selection of user favorites through presets 30 displayed on the screen by touching a particular point on the display 20. As illustrated in FIG. 4, if the system includes hard keys 32, the functionality of the hard keys 32 may at times be displayed on the display 20.

The system 10 is configured to receive, produce, or be in communication with a variety of input sources, which then are converted to an output to the user. For purposes of this application, whether the system 10 (1) receives the input signal wirelessly from external the vehicle or internal to the vehicle such as radio signals, wi-fi signals, or Bluetooth signals, (2) produces the signal such through as a built-in CD player or tape player, or (3) is in communication with the device, such as a plug-in device, or any other fixed or removable media or by any other means, shall all be referred to as the device being in communication with the selected input source. More specifically, any source of input, no matter how connected to the system, or even as part of the system shall be referred to as an input source in communication with the system.

The present invention may be added easily to known systems. The system 10, in addition to a user interface 12 having single-action presets 30, includes a controller to select the input source. For some input sources, the system may only passively interact by receiving signals and then selecting a particular selection within the input signals, such as an FM radio frequency or broadcast within the input source of the FM radio band. For other input sources, the system may include reciprocal communication with the input source, such as directing a mobile phone to dial a specified number, directing a navigation system to provide directions to a desired destination, or even access to a particular folder on a mass storage device. Examples of the input source include, but are not limited to, radio signals such as AM, FM, satellite and weather band signals, TV signals, video signals such as DVD, Satellite, Internet, mass storage devices, attached video players, and other sources, communication devices such as mobile phones, computer, and other devices, navigation systems, and other audio sources such as CDs, music players, mass storage devices, tape players, MP3 players, or other devices.

Previously, the management of different sources of media such as a selection of favorites has been via separate and distinct control schemes. More specifically, a group of presets only provided selection of specific functionality related to the current selected media source. A group of presets were not capable of being related to different sources such that presets of favorite selections within different media sources were not simultaneously available for access. For example, users did not have the ability to go directly from one FM station to an AM station or a particular iPod album and then to a particular satellite radio station through use of single-touch multi-source presets. Instead, a user needed to first select the next media mode and then the desired preset, of which all presets were related to the currently selected media mode.

The single-action presets 30 of the present invention allow a user with a single-action to change both the input source and select a specific selection related to the input source. If the preset is programmed to a radio band, such as the FM band and to a particular frequency within that radio band, a user may with a single-action change the system to output audio from the chosen FM radio station, no matter what the original input source was. Therefore, a user with a single-action may change the system from playing a CD to a desired radio station, even through that radio station was not previously playing when the CD was chosen as the input source. The system 10 may use any type of operating platform and software, so long as it is able to support the single action presets 30. As another example, the user by a single-action may press the preset 30, thereby instructing the system to mute the radio, change the input audio source to the mobile phone in communication with the system and for the specific selection instruct the mobile phone to dial a particular number. Similarly, if the system is in communication with a navigation system, the system in response to pressing a programmed preset 30 would select the navigation system as the input source and the specified selection may be an instruction for the navigation system to provide directions to a particular address. In some instances, the system 10 may change only one of the display or audio input source and keep the other of the display or audio constant. For example, with the above described navigation system, the system 10 may keep the audio input source, such as the radio being output to the user, however the display may be changed to a map showing directions to the selected address. The above selections are only examples of a wide variety of possibilities.

Figure 2:
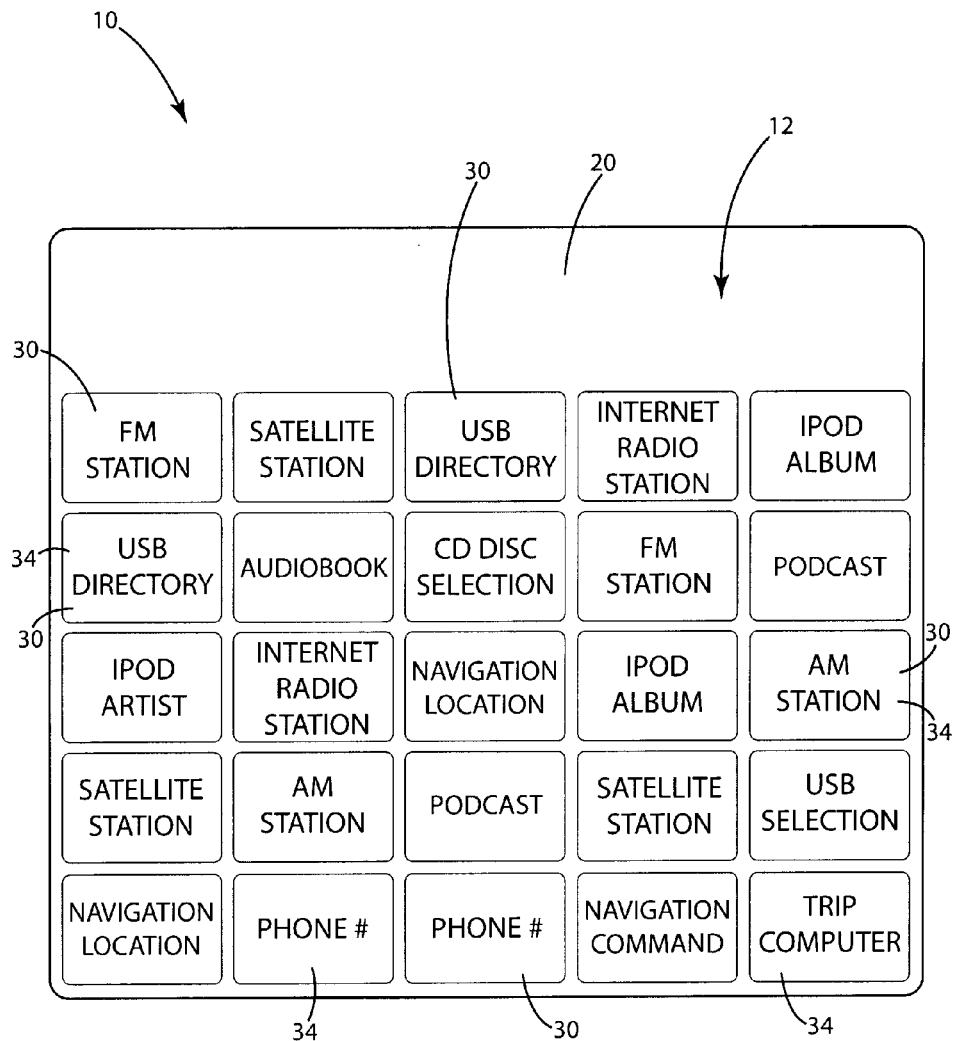
FIG. 2 is a schematic view of a vehicle entertainment system with an exemplary display screen showing exemplary soft key favorites across multi-source inputs on a single display screen.

As users are accustomed to many presets for each source, it may be desirable to provide presets 30 through the display, such as the illustrated soft-touch presets 34. Providing presets 30 through a display 20 such as a touch screen allows the manufacturer or user to select unique skins or looks for the displayed presets 30. For example, the system 10 may display only the active programmed presets such as six presets. As more presets are programmed, the system adds them and displays them. Only displaying the already programmed presets keeps the display 20 from becoming cluttered and allows room for displayed content to the user, in addition to the presets. Therefore, by using single-action multi-source presets 30, such as the illustrated soft presets 34 on a display 20, illustrated as a touch screen, a user can assign particular presets 30 or areas of the display 20 to multi-media favorites across different media sources. The presets 30 may be selectable no matter what input or media source is currently being used. However, in some embodiments, the displayed presets 30 may change or may be reorganized depending on user preferences. As illustrated in FIG. 2, a variety of media sources and desired favorites within those sources may be selected from a single screen on the display 20.

As illustrated in the figures, the use of soft touch presets 32 through an input device such as the display 20 or the like provides an easy to read and configure interface for a user. Although, as illustrated in FIG. 4, hard touch presets 34 may be used, the soft touch presets 32 allow for an easier graphic display and interface with the users. Displaying the soft touch interfaces 34 as illustrated in the figures also allows easy and visual modification and selection of the presets 20. Of course, hard key presets 34 and soft key presets may be used in combination with each other. In some embodiments, one of the hard key presets 34 and soft key presets 32 may relate to the selected source and not single-action presets.

In addition to the preset buttons 30 allowing selection of favorite stations across the radio bands, the user may configure the presets 30 to also refer to different sources. For example, the presets 30 labeled as FM station can refer to a specific bandwidth frequency within the FM band while the presets 30 labeled in FIG. 1 as CD disc selection may refer to a specified disc, while the presets 30 labeled as USB selection may refer to a media input such as a connected iPod, flash disc, or MP3 player. As further illustrated in the figures, the presets 30 may be set to any desired device, such as a particular phone number, a location in the navigation system, an artist, play list, album, or audio book on a music player, a folder on a USB device, or any other possible selection available to the user. For example, a person may have a preset 30 in all screens which when selected mutes the current audio source and dials a commonly used phone number such as the user's home or office. The system 10, while the user is listening to the radio, may allow on push a preset 30 to instruct the navigation system to provide directions to the address associated with that preset 30 while continuing to allow the user to listen to the radio.

Figure 3:
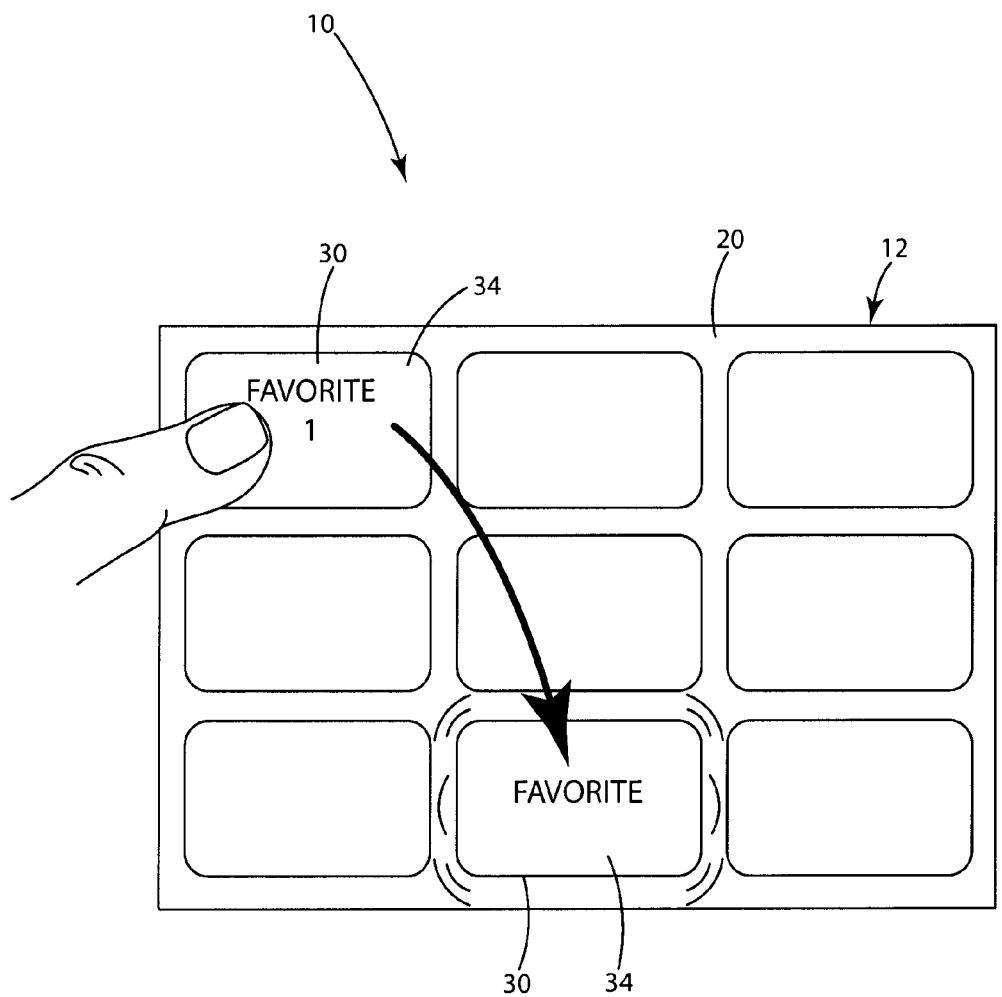
FIG. 3 is a schematic diagram illustrating the easy movement and programming of soft key buttons.

As illustrated in FIG. 3, the graphical interface allows easy moving or rearrangement of preset or favorite buttons as well as media selection of presets. The user selects a preset, such as by holding the preset for a short time, and then drags and drops the preset to a different location that suits the user. Therefore, the user can arrange preset buttons 30 along with media selection buttons to the preference of the user that allow the user to select their desired audio content from the vehicle entertainment system with as little distraction as possible and as quickly as possible.

The layout of presets in FIG. 2 illustrates an exemplary layout. Any desired layout may be used and the user may arrange the presets as desired, or use the provided manufacturer's arrangement. The system 10 is only constrained by the particular limitations of the vehicle entertainment system. As illustrated in FIG. 4, other layout configurations may be used and the buttons at the bottom of the screen may be used to select both media sources as well as favorite selections on particular media sources. The system 10 may include both hard presets 32 and soft presets 34 as illustrated in FIG. 4. The display 20 can also show a skin or desired graphical interface above the media buttons or other displayed content such as album art, an equalizer, or any other desired display content.

Figure 1:
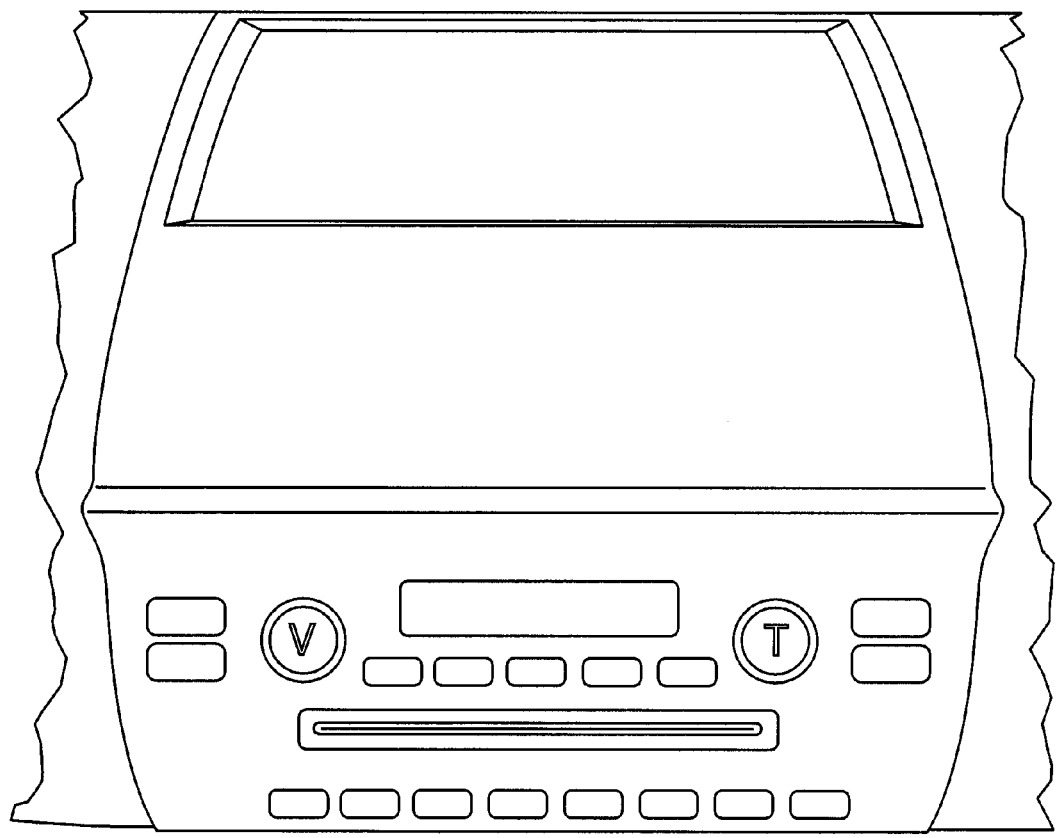
FIG. 1 is an illustration of a prior art radio display for a vehicle entertainment system, which is constrained to hard key preset allowing only single source favorites.

In some embodiments, the vehicle entertainment system 10 may be set up to have multiple menu screens such as an overall menu screen of FIG. 1 as well as more detailed menu screens of limited selection for different users or different user preferences. This allows the user to have different favorite screens and may also allow the users to set different grids for favorite presets 30 such as when a vehicle has two different drivers, the first user may have a desired display grid while the second user may have a different desired display grid.

As most listeners of music use very few presets in each media source, it may be possible for the total number of favorite presets across all media sources to be easily fit within one screen thereby simplifying the controls for the vehicle entertainment system.

In addition to the above described functionality for the single-action presets, the presets may also be configured to perform incomplete functions. For example, a complete function of a single-action preset would be a switch from playing a specific FM frequency to playing all songs by a particular artist. An similar but intentionally incomplete function of a single-action preset would be with the press of the preset button a switch from playing a specific FM frequency to a change in source to a mass storage device and a jump to asking which artist should the system play all songs by. Therefore, with a single button press, the system prompts them to select an artist and then starts to play all songs by that artist, therefore allowing with a single button press both a change in source and a commend input into the new source. With the use in incomplete single action presets that allow for changes that move the user through multiple menus with a single button push, and then ask for further input, the variety of uses is almost endless. While a few more examples are provided below of these incomplete function single action presets, the system is only limited by the imagination of the user of what types of commands they would like to enter.

As additional examples, by a single button push, the user may have the GPS system select and input a state and city and prompt for a street and address entry. By a single button push, the vehicle entertainment system may bring up a playlist of FM stations that are news radios and ask for the user to select one of the stations. By a single button push, the user may mute the entertainment system, connect to a telephone, and bring up a name of an individual for the user to select which phone number to call. As stated above, the above examples are only examples, and the functionality of the system is only limited by the user's imagination and the system would be easily adaptable to any new sources.

To provide quick navigation with only minimal processing power, the vehicle entertainment system may not record menu steps for each single action preset, but may instead act as a bookmark. Therefore, each possible item or function may be categorized with a directory location and the system upon the press of a single action preset button may bring the user to the function or items associated with the directory location that is assigned to the single action preset button. Therefore, when the user wants to record a location or function, such as prompting for which artist to play all songs by on a mass storage device, they just press the button to memorize the current location or prompt, in particular the directory location assigned to that location or prompt and the system may easily come back to the selected directory location.

The directory locations may be considered as similar to bookmarks of directory locations or menu locations that save place in the system that normally a variable routine is required using multiple button presses and inputs to reach. This directory system eliminates the need for the system to record user recorded sequences, which may be complicated and difficult to record due to the complexity of modern vehicle entertainment systems, as well as the processing power needed to follow through the same sequence. Use of a bookmark or location in the system to be saved as the preset allows the user to save incomplete tasks that require additional inputs, such as with a single press adds +5 to the bass, and with a second press −5 from the bass and a third press returns the system to normal. The single action presets allow the system to save locations, without complicated sequences and without the need for voice input prompts which are not always reliable and require additional expensive components. Other examples may be single action adjustments of screen brightness, changes in GPS viewpoints and scale and are only limited by the user's imagination. Each menu location generally has an attached directly location, which allows each menu location to be bookmarked and saved.

The foregoing discussion discloses and describes an exemplary embodiment of the preset invention. One skilled in the art will readily recognize from such discussion, and from the accompanying drawings and claims that various changes, modifications and variations can be made therein without departing from the true spirit and fair scope of the invention as defined by the following claims.

What is claimed is:

1. A method of performing a selection in input sources and selecting at least one selection within the selected input source with an entertainment system, said method comprising:

engaging a single-action preset button that in response to only a single-action performs the steps of:
changing the active input source selected from AM radio feed, FM radio feed, satellite radio feed, TV feed, internet connection, mobile phone interface, navigation interface, mass storage device, computer interface, music player, CD changer, internet radio, remote servers and video interface to a selected preprogrammed climate control system input source associated with the single action preset button;
displaying a user input prompt relating to the selected climate control system input source.

2. The method of claim 1 wherein said input sources include an AM radio feed, an FM radio feed, and a satellite radio feed.

3. The method of claim 1 wherein said input sources include at least nine of an AM radio feed, FM radio feed, satellite radio feed, TV feed, internet connection, mobile phone interface, navigation interface, mass storage device, computer interface, music player, CD changer, internet radio, remote servers, and video interface.

4. The method of claim 1 wherein said single-action preset button selects an input source that is different than the currently selected input source.

5. The method of claim 1 wherein said a second single-action preset button is programmable to through said single-action be capable of selecting a specific selection within said currently selected input source.

* * * * *